United States Patent
Fukamachi et al.

(10) Patent No.: US 7,705,692 B2
(45) Date of Patent: Apr. 27, 2010

(54) HIGH-FREQUENCY CIRCUIT AND COMMUNICATIONS APPARATUS COMPRISING SAME

(75) Inventors: Keisuke Fukamachi, Saitama-ken (JP); Shigeru Kemmochi, Saitama-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 299 days.

(21) Appl. No.: 11/397,602

(22) Filed: Apr. 5, 2006

(65) Prior Publication Data

US 2006/0229035 A1 Oct. 12, 2006

(30) Foreign Application Priority Data

Apr. 7, 2005 (JP) .............................. 2005-110867

(51) Int. Cl.
*H01P 5/18* (2006.01)
(52) U.S. Cl. ....................... 333/109; 455/83; 455/114.1
(58) Field of Classification Search ................. 333/109, 333/81 R, 81 A; 455/117, 125, 83, 114.1
See application file for complete search history.

(56) References Cited

U.S. PATENT DOCUMENTS

| 4,468,607 | A | * | 8/1984 | Tanaka et al. ................ 323/354 |
| 5,196,806 | A | | 3/1993 | Ichihara |
| 5,367,268 | A | | 11/1994 | Baba et al. |
| 6,496,708 | B1 | * | 12/2002 | Chan et al. ................ 455/553.1 |
| 6,603,960 | B1 | | 8/2003 | Oida et al. |
| 6,972,640 | B2 | * | 12/2005 | Nagamori et al. ........... 333/116 |
| 2002/0180556 | A1 | * | 12/2002 | Watanabe et al. ........... 333/126 |
| 2003/0192475 | A1 | * | 10/2003 | Shannon et al. ............. 118/715 |
| 2004/0227502 | A1 | * | 11/2004 | Wyse et al. ............. 324/117 R |
| 2004/0266378 | A1 | * | 12/2004 | Fukamachi et al. ...... 455/188.1 |

FOREIGN PATENT DOCUMENTS

| EP | 0481524 | | 4/1992 |
| EP | 1134834 | A | 9/2001 |
| JP | 2000-278167 | | 10/2000 |
| JP | 2001-274723 | | 10/2001 |
| JP | 2003-037520 | | 2/2003 |
| JP | 2004-304435 | A | 10/2004 |
| WO | WO 03/092997 | A2 | 11/2003 |

OTHER PUBLICATIONS

Kryshtopin A et al: "Novel high-accuracy LTCC-integrated power monitors for 2.4 and 5 GHz wireless-LAN applications" Microwave Symposium Digest, 2004 IEEE MTT-S International for Worth TX, USA Jun. 6-11, 2004, Piscataway, NJ, IEEE, vol. 2, Jun. 6, 2004, pp. 1275-1278, XP010728374 ISBN 0-7803-8331-1.

* cited by examiner

*Primary Examiner*—Robert Pascal
*Assistant Examiner*—Gerald Stevens
(74) *Attorney, Agent, or Firm*—Sughrue Mion, PLLC

(57) ABSTRACT

A high-frequency circuit for use in a dual-band wireless communications apparatus selectively using first and second frequency bands, comprising a diplexer connected to the output of a power amplifier for sending either one of transmission signals in the first and second frequency bands to an antenna, a coupler having a primary line connected to a common end of the diplexer and a secondary line, a detector comprising a detection diode for detecting a transmission power of a high-frequency signal sent from the secondary line of the coupler, and a harmonics-suppressing circuit disposed between the secondary line of the coupler and the detection diode.

6 Claims, 12 Drawing Sheets

HIGH-FREQUENCY CIRCUIT AND COMMUNICATIONS APPARATUS COMPRISING SAME

FIELD OF THE INVENTION

The present invention relates to a high-frequency circuit handling at least two communications systems and having a function to detect a transmission power, and an apparatus comprising such high-frequency circuit for wireless communications among electronic appliances.

BACKGROUND OF THE INVENTION

Data communications by wireless LAN (local area network) according to IEEE802.11 are now widely used. They are used as signal-transmitting means in place of personal computers (PCs); PC peripherals such as printers, hard disk drives, broadband routers, etc.; electronic appliances such as facsimiles, refrigerators, standard-definition televisions (SDTVs), high-definition televisions (HDTVs), digital cameras, digital video recorders, cell phones, etc.; and wired communications of automobiles and aircrafts, and wireless data transmission is conducted among these electronic appliances.

There are IEEE802.11a, IEEE802.11b and IEEE802.11g as the standards of wireless LAN. IEEE802.11a is adapted to high-speed data communications of 54 Mbps at maximum in a frequency band of 5 GHz, using an orthogonal frequency division multiplex (OFDM) system. IEEE802.11b is adapted to high-speed communications of 5.5 Mbps and 11 Mbps in an industrial, scientific and medical (ISM) band of 2.4 GHz that can be freely used without wireless license, using a direct sequence spread spectrum (DSSS) system. IEEE802.11g is adapted to high-speed data communications of 54 Mbps at maximum in a 2.4-GHz band like IEEE802.11b, using the OFDM system.

WO 03/092997 describes a multi-band communications apparatus for such wireless LAN. As shown in FIG. 15, a high-frequency circuit used in this multi-band communications apparatus comprises two dual-band antennas capable of transmitting and receiving signals in two communications systems (IEEE802.11a, IEEE802.11b) with different frequency bands, a high-frequency switch SW1 having four ports for switching the connections of transmission circuits and receiving circuits, a diplexer 3 disposed between one port of the high-frequency switch SW1 and the transmission circuits, and a diplexer 5 disposed between another port of the high-frequency switch SW1 and the receiving circuits, thereby being able to conduct diversity reception.

There is IEEE802.11h, a communications system making wireless LAN usable in Europe. This requires a transmission power control (TPC) function to reduce a transmission power, when good transmission can be obtained even though the transmission power is suppressed, for instance, because terminals are close to base stations. For this purpose, the output power should be able to be controlled more precisely than the conventional wireless LAN.

As shown in FIG. 15 of WO 03/092997, the conventional power control circuit for wireless LAN comprises a coupler between a power amplifier PA1 and a diplexer 3 for transmission signals, a detection signal from the coupler being rectified by a detector comprising a detection diode D2 and a smoothing circuit C2, R2, to control an output signal of RFIC based on the resultant detection voltage. This power control circuit requires a coupler, and a detector comprising a detection diode and a smoothing circuit for both of PA1 in a 2.4-GHz band and PA2 in a 5-GHz band, as well as an analog switch 6 for selecting detection voltage terminals for the 2.4-GHz band and the 5-GHz band. Accordingly, it needs many parts, resulting in difficulty in reducing the size of an communications apparatus.

To solve this problem, Japanese Patent 3,371,887 proposes a circuit comprising a coupler 7 connected to a common end of a diplexer 3, as shown in FIG. 16. This circuit has parts whose number is reduced to ½ or less of that in the detection circuit shown in FIG. 15, and can monitor an output power at a position near an antenna, resulting in improved detection precision. However, because both transmission powers in a 2.4-GHz band and a 5-GHz band should be detected in the circuit shown in FIG. 16, it is extremely difficult to keep the relation between output power and detection voltage constant, when the coupling degree of the coupler largely depends on a frequency.

A detection diode (Schottky diode) should be disposed to detect transmission powers in both 2.4-GHz and 5-GHz bands, but it generates harmonic signals due to its detection distortion. The harmonic signals mainly having frequencies 2 or 3 times those of the transmission signals are reflected toward the coupler, so that most of them are radiated from the antenna via the coupler. With respect to the frequency dependency of the coupling degree of the coupler, for instance, small, low-loss, laminated couplers generally have coupling degrees of −15 dB and −10 dB, respectively, in a 2.4-GHz band and a 5-GHz band, this difference directly affecting their detection voltages. In this case, the detection voltage is +0.5 V at 2.45 GHz and +1 V at 5.4 GHz, for instance, when there is an output of +20 dBm at an antenna end as shown in FIG. 14. Such variations of the detection voltage depending on the frequency should be reduced to enable the TPC function.

OBJECTS OF THE INVENTION

Accordingly, an object of the present invention is to provide a high-frequency circuit with reduced harmonic signals generated by a detection diode, small variations of a detection voltage in pluralities of frequencies, and a small number of parts.

Another object of the present invention is to provide a wireless LAN communications apparatus comprising such high-frequency circuit.

DISCLOSURE OF THE INVENTION

The first high-frequency circuit of the present invention comprises a coupler having a primary line having input and output ends for a transmission signal and a secondary line, a detector comprising a detection diode for detecting a transmission power of a high-frequency signal sent from the secondary line of the coupler, and a harmonics-suppressing circuit disposed between the secondary line of the coupler and the detection diode.

The second high-frequency circuit of the present invention for use in a dual-band wireless communications apparatus selectively using first and second frequency bands comprises a diplexer connected to the output side of a power amplifier for sending either one of transmission signals in the first and second frequency bands to an antenna, a coupler having a primary line connected to a common end of the diplexer and a secondary line, a detector comprising a detection diode for detecting a transmission power of a high-frequency signal sent from the secondary line of the coupler, and a harmonics-suppressing circuit disposed between the secondary line of the coupler and the detection diode.

The harmonics-suppressing circuit is preferably a lowpass filter circuit or a notch filter circuit constituted by one or more transmission lines and one or more capacitors, or an attenuator circuit constituted by one or more resistors. Although the harmonics-suppressing circuit has conventionally been disposed in a main line, through which a transmission signal and a receiving signal pass, it is disposed between the coupler and the detection diode in the present invention. This makes it possible to drastically reduce the loss of the main line, through which a transmission signal and a receiving signal pass, resulting in higher quality and lower power consumption of communications.

The lowpass filter circuit or the notch filter circuit constituting the harmonics-suppressing circuit in the high-frequency circuit of the present invention preferably has an attenuation pole adjusted to 2 or 3 times the passband frequency, without attenuation at the passband frequency. This makes it possible to reduce only harmonic signals while keeping the detection voltage constant.

The lowpass filter circuit and the notch filter circuit are effective when a signal being detected has a relatively narrow passband.

When used in a dual-band wireless communications apparatus selectively using first and second frequency bands, the attenuator circuit constituted by one or more resistors is more preferable than the lowpass filter circuit and the notch filter circuit, because the attenuator can attenuate a signal in a wide band. For instance, when the first and second frequency bands are a 2.4-GHz band and a 5-GHz band, respectively, detection in the 5-GHz band is insufficient in the lowpass filter circuit and the notch filter circuit, because a second-harmonic signal in the first frequency band is substantially 5 GHz. On the other hand, the attenuator circuit attenuates not only a detected signal from the coupler but also reflected waves of harmonic signals generated by the detection diode. Although the use of the attenuator circuit makes it necessary for the coupler to have a large coupling degree to keep the detection voltage constant, it is advantageous in providing sufficient attenuation in a broad band.

The harmonics-suppressing circuit is preferably a notch filter constituted by an inductor, a diode, a capacitor, a resistor and a power-supplying terminal for attenuating frequencies 2 or 3 times those of transmission signals in a first frequency band (for instance, 2.4-GHz band) and a second frequency band (for instance, 5-GHz band), and it is preferable to use a variable notch filter having a variable resonance frequency attenuated by voltage applied to the power-supplying terminal. By ON/OFF of the power-supplying terminal of the variable notch filter, the attenuation pole can be set to a frequency 2 times that of the first transmission signal when a transmission signal in the first frequency band is sent to the antenna, and to the frequency of a second harmonic of the second transmission signal when a transmission signal in the second frequency band is sent to the antenna. Thus, by changing the attenuation poles in both bands, the second harmonics can be reduced by one filter.

A matching circuit constituted by a shunt inductor connected to the coupling line of the coupler, and/or a matching circuit constituted by a shunt inductor and a phase circuit connected between the coupling line of the coupler and the detection diode are preferably disposed between the secondary line of the coupler and the harmonics-suppressing circuit. This matching circuit is preferably adjusted such that impedance matching is obtained between the coupling line of the coupler and the detection diode in a first frequency band (for instance, 2.4-GHz band). This increases the detection voltage in a 2.4-GHz band, in which the coupler has a small coupling degree and the detection voltage is small, thereby reducing differences from the detection voltage in a 5-GHz band. This matching circuit can separately adjust impedance matching in an amplitude direction by the shunt inductor and impedance matching in a phase direction by the phase circuit on a Smith chart. As a result, impedance matching can be easily adjusted between the coupling line of the coupler and the detection diode in a 2.4-GHz band.

The high-frequency circuit of the present invention preferably comprises a switch circuit for switching a transmission signal and a receiving signal, which comprises one or more antenna ends for inputting and outputting a transmission signal and a receiving signal, one or more transmission ends for inputting a transmission signal, and one or more receiving ends for outputting a receiving signal, the transmission end of the switch circuit being connected to the primary line of the coupler. When the first frequency band is a 2.4-GHz band, and the second frequency band is a 5-GHz band, this circuit structure can provide a dual-band RF front-end circuit applicable to the communications systems of IEEE802.11a, IEEE802.11b and IEEE802.11g. This circuit structure can also provide a single-band RF front-end circuit usable in a 2.4 GHz band or a 5 GHz band.

The wireless communications apparatus of the present invention comprises the above-described high-frequency circuit.

DESCRIPTION OF THE PREFERRED EMBODIMENTS

Figure 1:
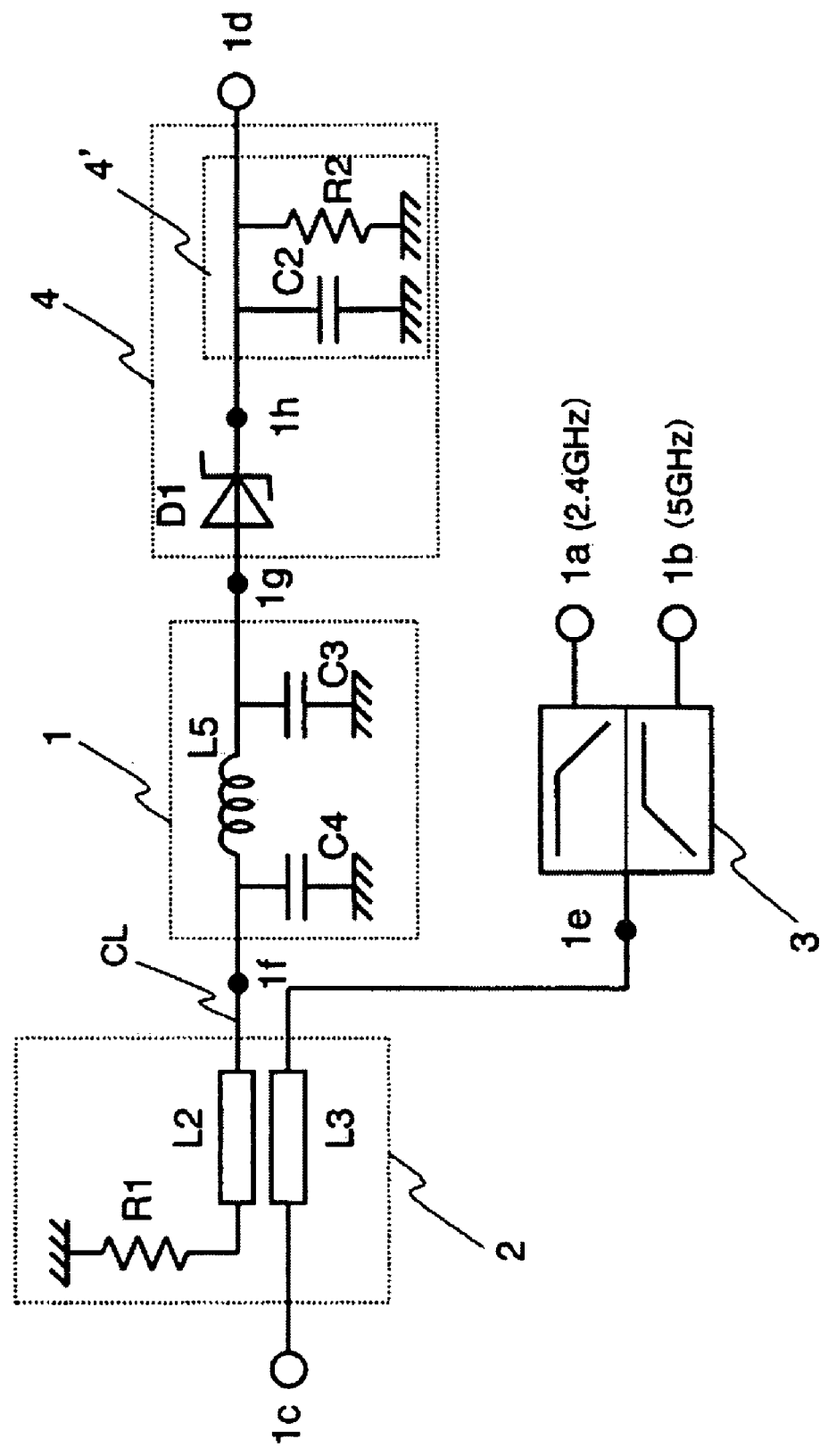
FIG. 1 is a block diagram showing a high-frequency circuit comprising a harmonics-suppressing circuit according to one embodiment of the present invention.

FIG. 1 shows a high-frequency circuit according to one embodiment of the present invention. This high-frequency circuit comprises a diplexer 3, a coupler 2, a detector 4 comprising a detection diode D1 and a smoothing circuit 4', and a harmonics-suppressing circuit 1 disposed between the coupler 2 and the detection diode D1. The diplexer 3 is constituted by a combination of a lowpass filter and a highpass filter, which are constituted, for instance, by LC circuits. The coupler 2 is constituted by a primary line L3, a secondary line L2 and a resistor R1. A coupling line CL on the side of the secondary line L2 of the coupler 2 is connected to the harmonics-suppressing circuit 1 and the detector 4 in series. The detection diode D1 in the detector 4 has an anode terminal 1g connected to the harmonics-suppressing circuit 1, and a cathode terminal 1h connected to the smoothing circuit 4'.

A transmission signal in a 2.4-GHz band (IEEE802.11b) and a transmission signal in a 5-GHz band (IEEE802.11a) are input to the input ends 1a and 1b of the diplexer 3, and transmission signals sent from the diplexer 3 to the antenna are input to the input end 1e of the coupler 2 and output from the output end 1c of the coupler 2. Because the primary line L3 and the secondary line L2 are coupled at high frequencies, part of the transmission signal is output to the coupling end 1f of the coupling line CL.

A high-frequency signal passing through the coupler 2 and the harmonics-suppressing circuit 1 is input to the detection diode D1, and only a high-frequency signal exceeding the forward voltage of the detection diode D1 is transmitted to the cathode terminal 1h, converted to DC by the smoothing circuit 4', and output to the detection terminal 1d as a plus DC voltage. This detection signal is fed back to a transmission power amplifier via an RFIC circuit, etc. for use as a control.

Figure 7A:
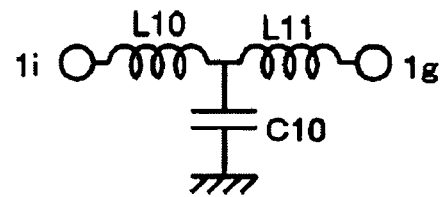
FIGS. 7(a) & 7(b) is a view showing one example of lowpass filters used in the harmonics-suppressing circuit of the present invention.
Figure 7B:
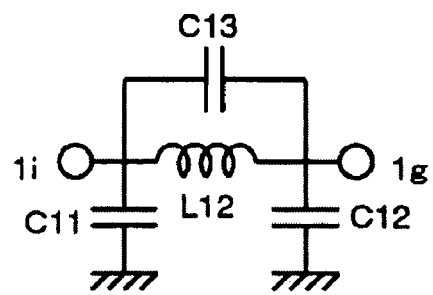
Figure 8A:
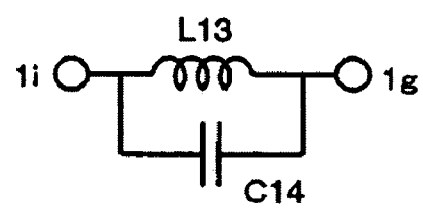
FIGS. 8(a) & 8(b) is a view showing one example of notch filters used in the harmonics-suppressing circuit of the present invention.
Figure 8B:
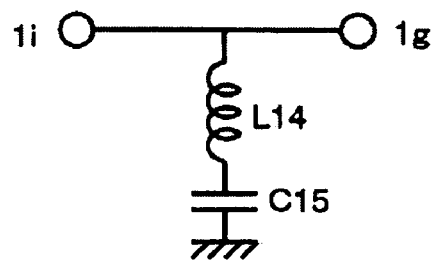

Harmonic signals generated in rectification by the detection diode D1 are reflected and radiated through the antenna via the coupler 2. Provided to prevent this is the harmonics-suppressing circuit 1 as shown in FIG. 1. The harmonics-suppressing circuit 1 is constituted by a π-type lowpass filter having an attenuation pole, for instance, in a 10-GHz band, a second harmonic wave of the 5-GHz band. The attenuation pole may be in a third harmonic band of a 2.4-GHz band or in a second or third harmonic band of a 5-GHz band, depending on the circuit structure. Other examples of the harmonics-suppressing circuit 1 are a lowpass filter constituted by an LC circuit as shown in FIGS. 7(a) and 7(b), and a notch filter as shown in FIGS. 8(a) and 8(b). Although the lowpass filter provides large attenuation at frequencies exceeding the attenuation pole, it is not suitable for miniaturization because it needs large numbers of elements. Although the notch filter provides small attenuation at frequencies exceeding the attenuation pole, it easily achieves miniaturization because of small numbers of elements. The connection of the harmonics-suppressing circuit 1 to the anode of the detection diode D1 makes it possible to detect a positive detection voltage.

Figure 2:
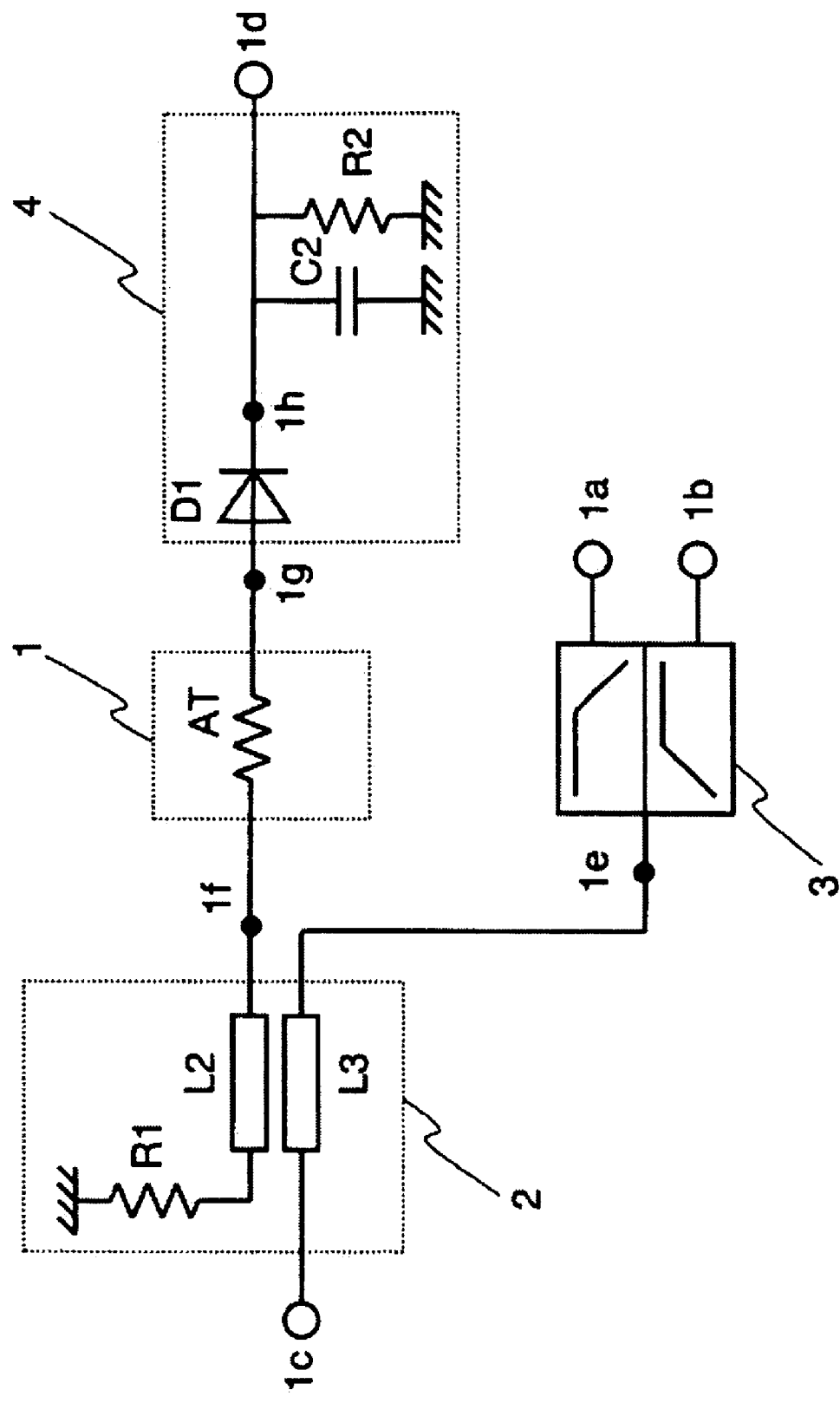
FIG. 2 is a block diagram showing a high-frequency circuit comprising a harmonics-suppressing circuit according to another embodiment of the present invention.
Figure 9A:
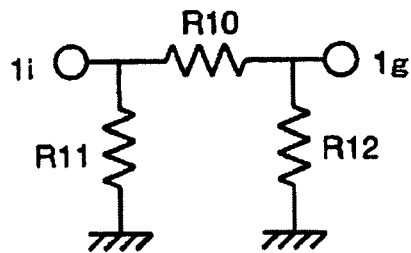
FIGS. 9(a) & 9(b) is a view showing one example of attenuators used in the harmonics-suppressing circuit of the present invention.
Figure 9B:
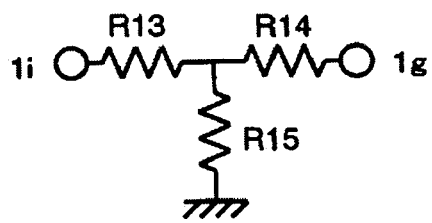

FIG. 2 shows an example of the harmonics-suppressing circuit 1, which is constituted by an attenuator AT. The attenuator AT comprises a resistor for providing voltage drop to reduce the intensity of a high-frequency signal. FIGS. 9(a) and 9(b) show specific examples of attenuators constituted by pluralities of resistors. In general, an attenuator constituted by pluralities of resistors can provide higher attenuation than an attenuator of one resistor in a broad band, although the former is not suitable for miniaturization.

Figure 10:
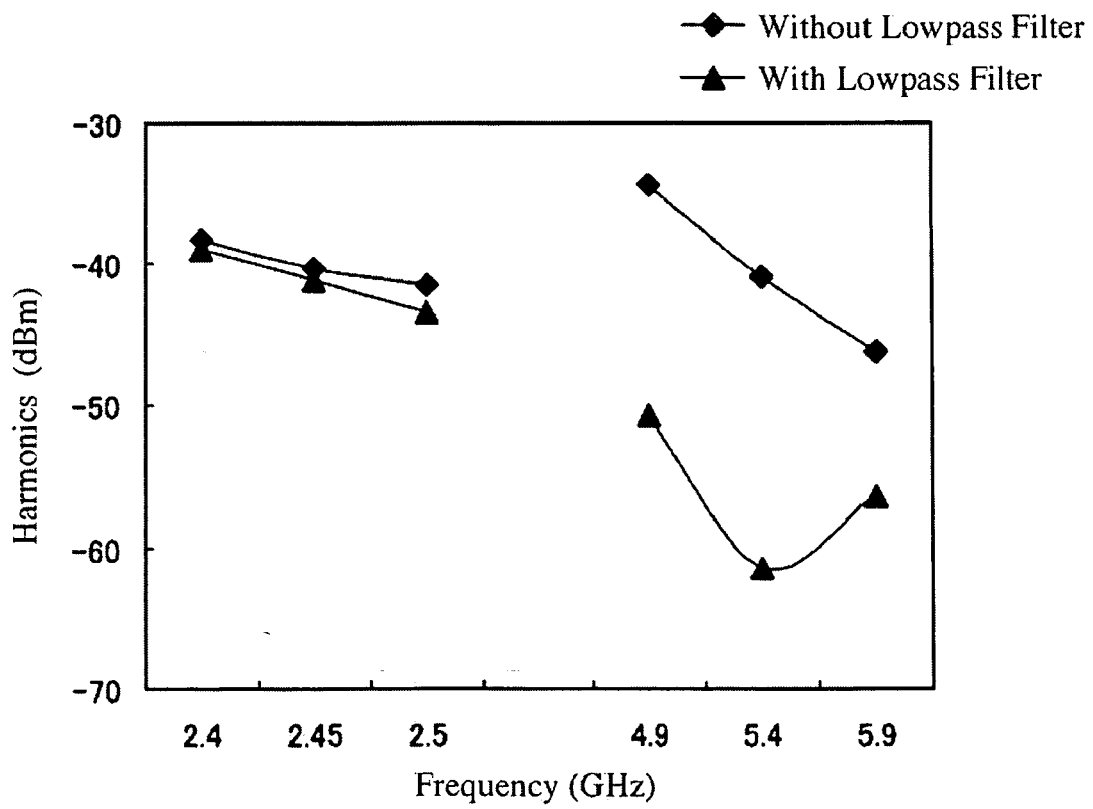
FIG. 10 is a graph showing the harmonics-attenuating characteristics of the harmonics-suppressing circuit of FIG. 1.
Figure 11:
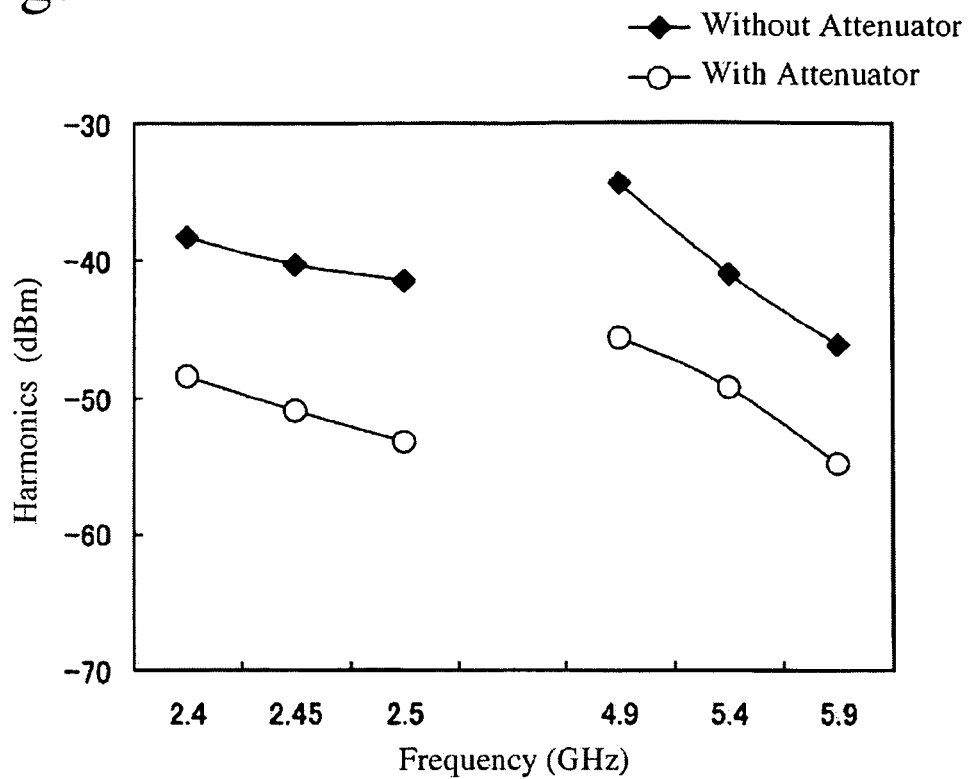
FIG. 11 is a graph showing the harmonics-attenuating characteristics of the harmonics-suppressing circuit of FIG. 2.

With respect to the harmonics-suppressing circuit 1 constituted by a π-type lowpass filter as shown in FIG. 1 and the harmonics-suppressing circuit 1 constituted by the attenuator AT as shown in FIG. 2, the characteristic values (dBm) of second harmonics generated in a 2.4-GHz band and a 5-GHz band were measured. The results are shown in FIGS. 10 and 11. As is clear from FIGS. 10 and 11, there are harmonics-suppressing effects of 10 dB or more except in the 2.4-GHz band in FIG. 10. Why an improved harmonics-suppressing effect is not obtained by the lowpass filter in the 2.4-GHz band appears to be due to the fact that the attenuation pole of the lowpass filter is set at 10 GHz.

Figure 3:
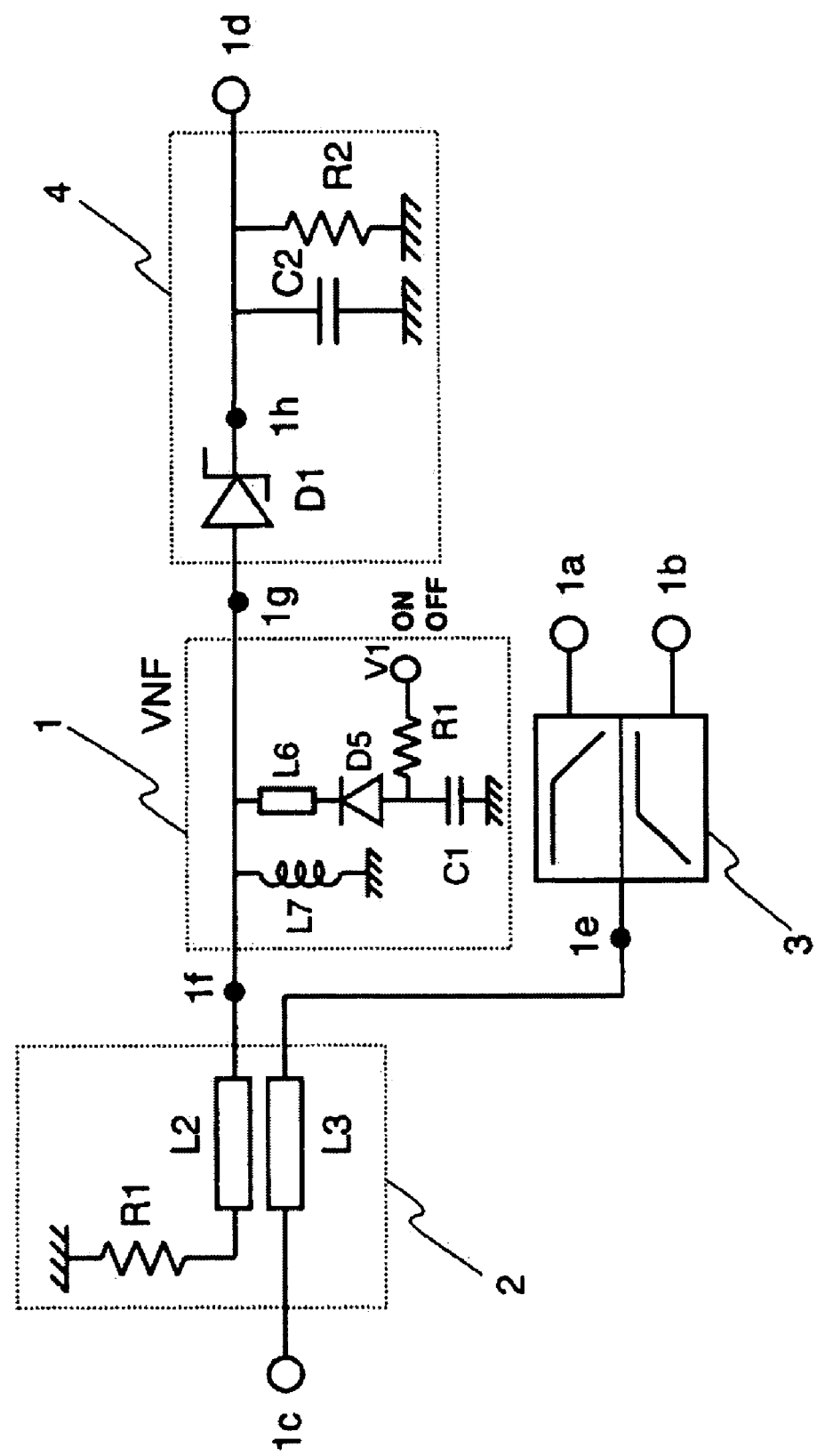
FIG. 3 is a block diagram showing a high-frequency circuit comprising a harmonics-suppressing circuit according to a further embodiment of the present invention.

FIG. 3 shows an example of high-frequency circuits, in which a harmonics-suppressing circuit 1 is constituted by a variable notch filter. The variable notch filter VNF is constituted by a transmission line or inductor L6, a choke coil L7, a capacitor C1, a diode switch D5, and a resistor R1. The transmission line L6, the diode D5 and the capacitor C1 constitute a series resonance circuit, whose resonance frequency varies by ON/OFF of the diode D5. That is, it is usual that the diode is nearly short-circuited in an ON state, while it has a capacitance of 0.1-1.0 pF in an OFF state. Accordingly, a series resonance circuit is formed by L6 and C1 in an ON state, and by L6, C1 and the capacitance of the diode D5 in an OFF state. Thus, the attenuation pole of the resonance circuit can be changed by ON/OFF of the diode D5.

Figure 12:
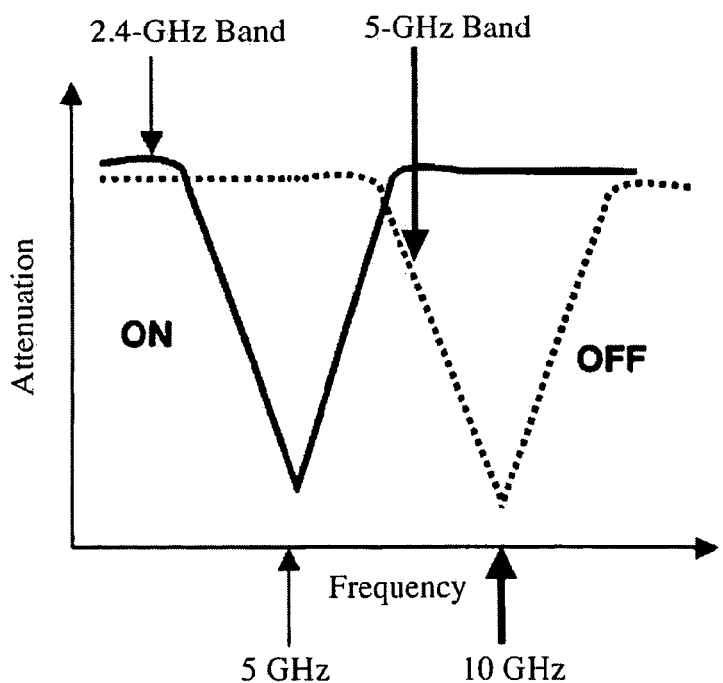
FIG. 12 is a graph showing the harmonics-attenuating characteristics of the harmonics-suppressing circuit of FIG. 3.

The characteristics of the variable notch filter VNF shown in FIG. 3 are shown in FIG. 12. The variable notch filter VNF has an attenuation pole at a frequency of about 5 GHz, 2 times the frequency (2.4 GHz) of the first transmission signal when the diode D5 is in an ON state, and an attenuation pole at a frequency of about 10 GHz, 2 times the frequency (5 GHz) of the second transmission signal when the diode D5 is in an OFF state. Because the resonance frequencies at ON and OFF of the diode D5 can be arbitrarily adjusted by a combination of L6 and C1, the attenuation pole can also be set at the frequency of a third harmonic. To turn the diode D5 to an ON state, DC current should be caused to flow through the diode D5 by applying voltage of about 0.5 V or more to the diode D5, and a choke coil L7 is needed for this DC current. The choke coil L7 is preferably 2 nH or more such that it has large impedance to signals in a 2.4 GHz band and a 5-GHz band. In this embodiment, a choke coil L7 is 5.6 nH. A resistor R1 is disposed between the anode of the diode D5 and a power-supplying terminal V1, to limit electric current flowing through the diode D5. In this embodiment, the resistor R1 is 2 kΩ.

Figure 4:
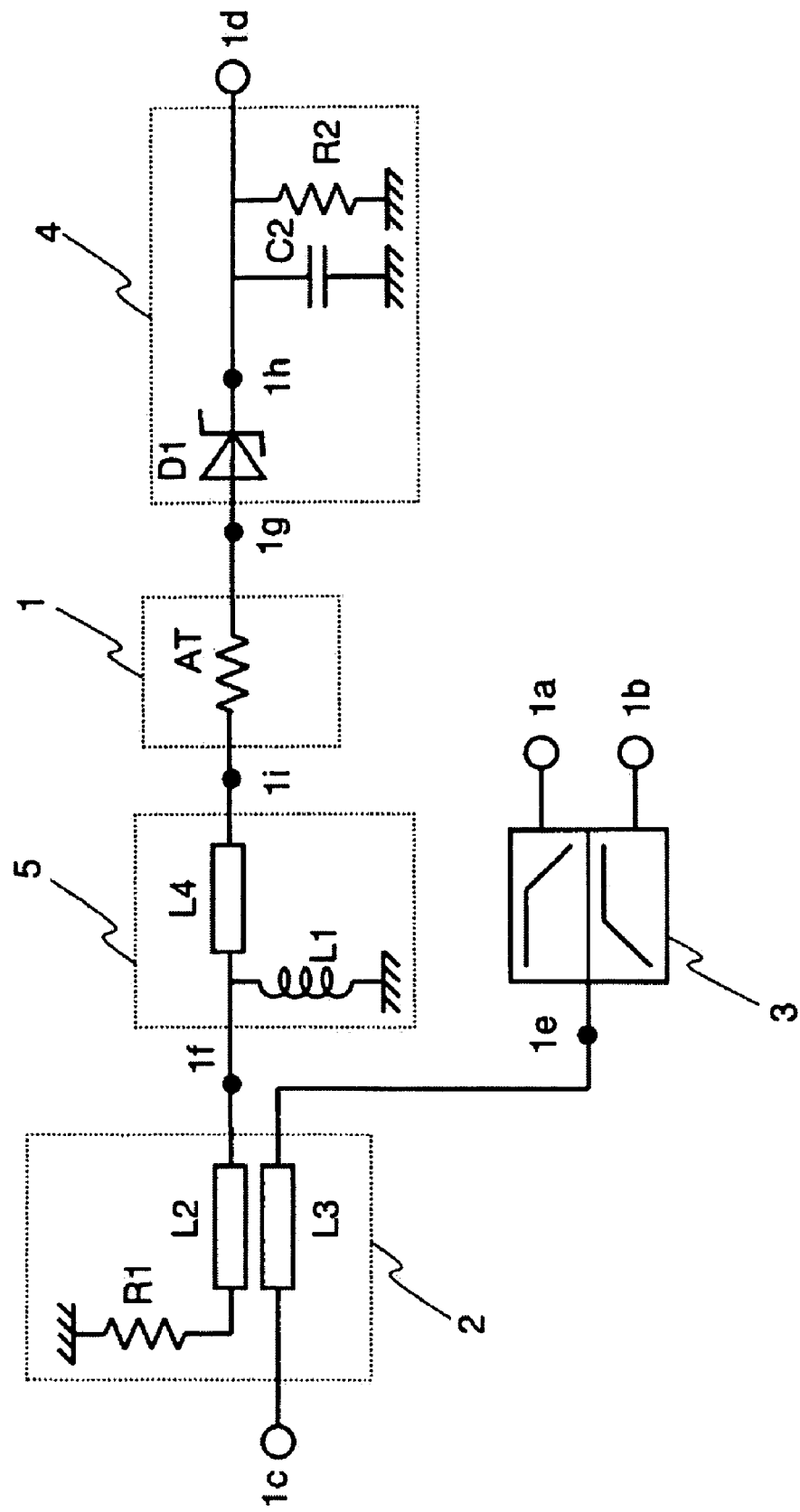
FIG. 4 is a block diagram showing a high-frequency circuit comprising a harmonics-suppressing circuit and a matching circuit according to a still further embodiment of the present invention.

FIG. 4 shows a high-frequency circuit according to a still further embodiment of the present invention. This high-frequency circuit comprises a matching circuit 5 between the secondary line L2 of the coupler 2 and the harmonics-suppressing circuit 1. The matching circuit 5 is constituted by a shunt inductor L1 and a phase circuit L4, a coupling signal being input from a coupling end 1f, and output to a detection diode D1 via an attenuator AT. The constants of the shunt inductor L1 and the phase circuit L4 are set to provide matching between the impedance of the coupling end 1f and the impedance of the coupling end 1i on the side of the detection diode D1 in a 2.4-GHz band. The matching circuit 5 can separately adjust impedance matching in an amplitude direction by the shunt inductor L1, and impedance matching in a phase direction by the phase circuit L4 on a Smith chart. Accordingly, impedance matching can be easily adjusted between the coupling end and the detection diode D1 in a 2.4-GHz band. This can increase detection voltage even in a 2.4-GHz band in which the conventional circuit shown in FIG. 13 has a small coupling degree of the coupler and a small detection voltage, so that the difference from the detection voltage in a 5-GHz band can be reduced.

Figure 13:
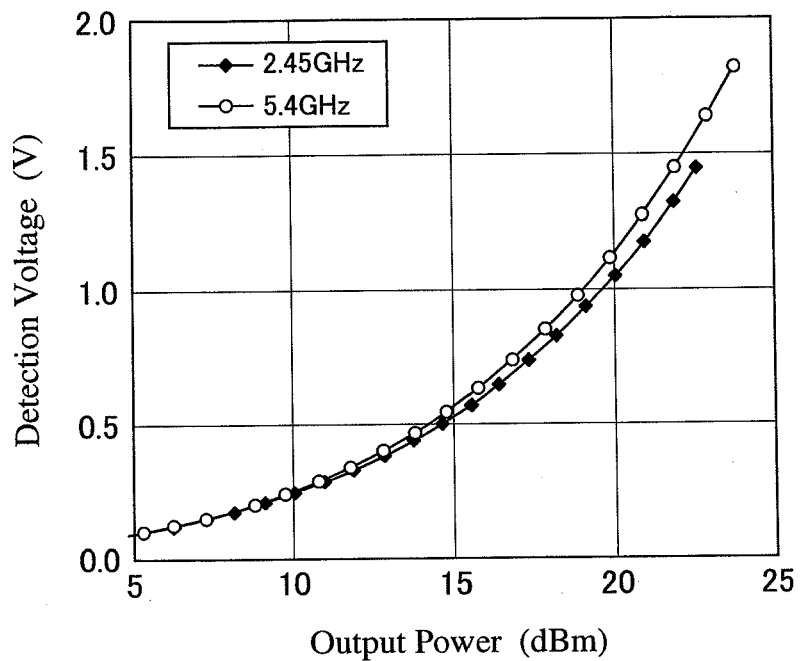
FIG. 13 is a graph showing the relation between output power and detection voltage in the high-frequency circuit of FIG. 4.
Figure 14:
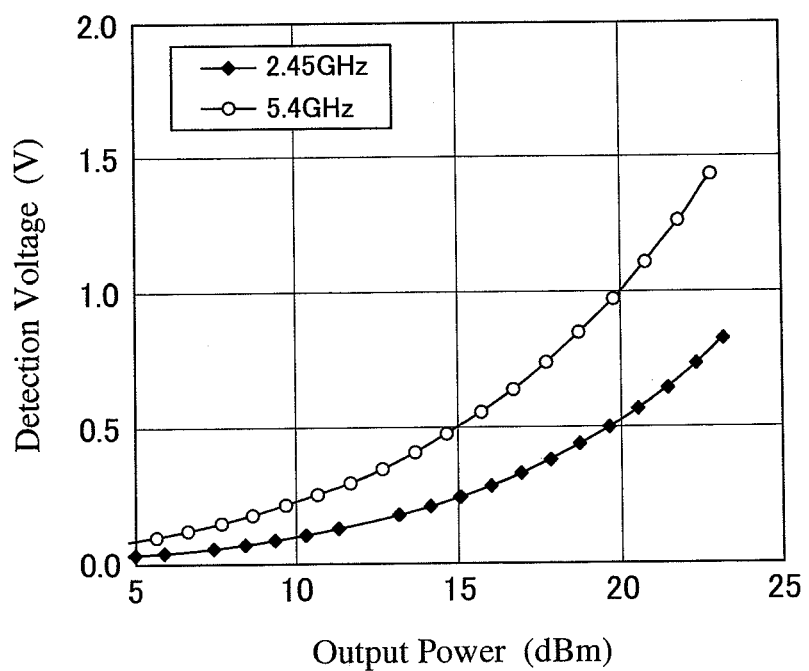
FIG. 14 is a graph showing the relation between output power and detection voltage in a conventional high-frequency circuit.

FIG. 13 shows the relation between output power and detection voltage in the high-frequency circuit shown in FIG. 4. Compared with the conventional circuit shown in FIG. 14, the difference between the detection voltage in a 2.4-GHz band and the detection voltage in a 5-GHz band is much smaller.

In the embodiment shown in FIG. 4, the harmonics-suppressing circuit 1 reduces harmonics, and the matching circuit 5 suppresses the variations of the coupling degree and the detection voltage, which depend on a frequency.

In the embodiment shown in FIG. 4, a matching circuit 5 comprises both shunt inductor L1 and phase circuit L4, although modifications are possible depending on impedance matching between a coupling end 1f and the detection diode D1. For instance, the shunt inductor L1 or the phase circuit L4 may be used alone as the matching circuit 5 to achieve both impedance matching and miniaturization.

Figure 5:
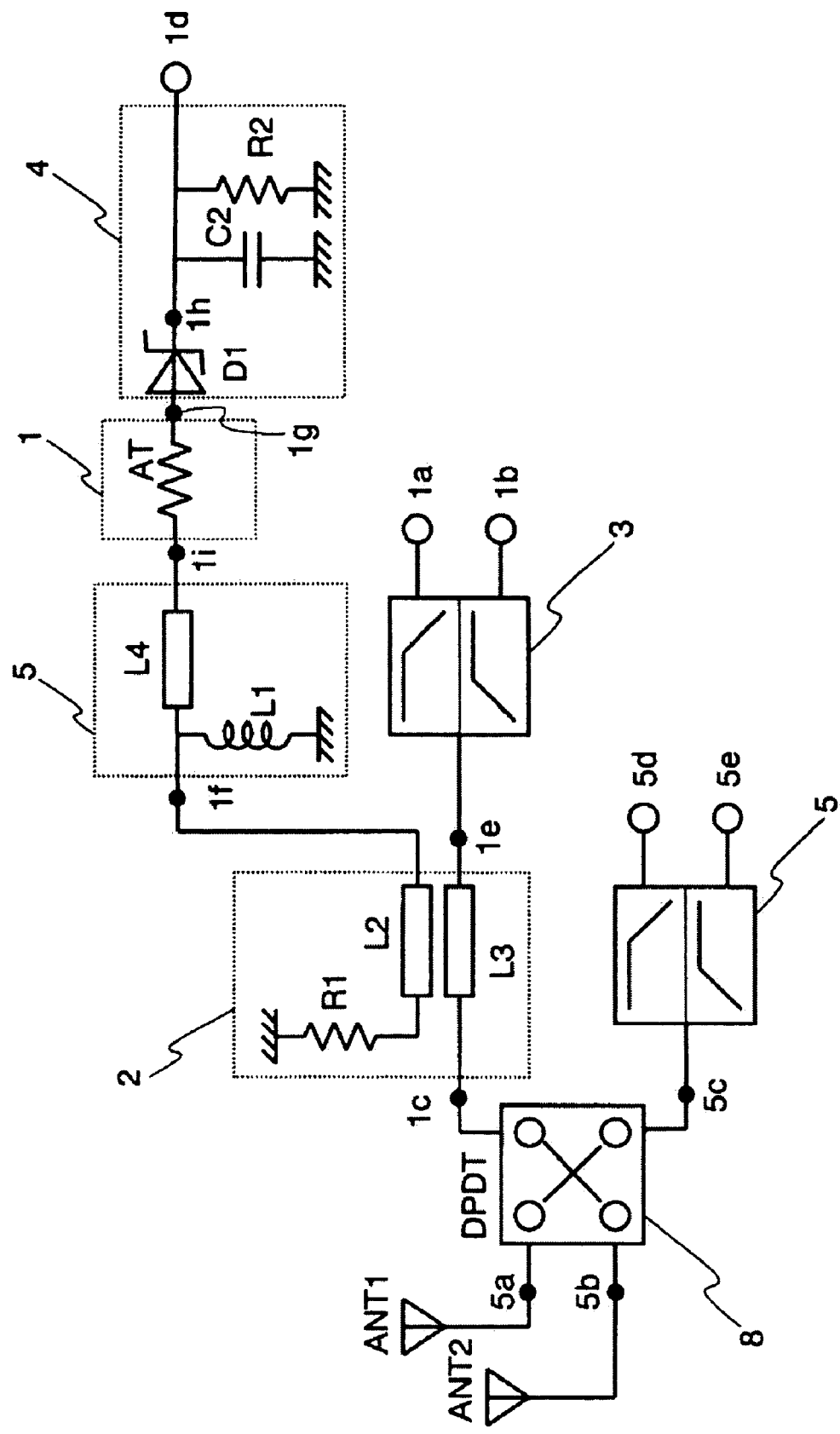
FIG. 5 is a block diagram showing a high-frequency circuit according to a still further embodiment of the present invention, which is obtained by adding a switch circuit, a diplexer circuit, etc. to the high-frequency circuit of FIG. 4.
Figure 15:
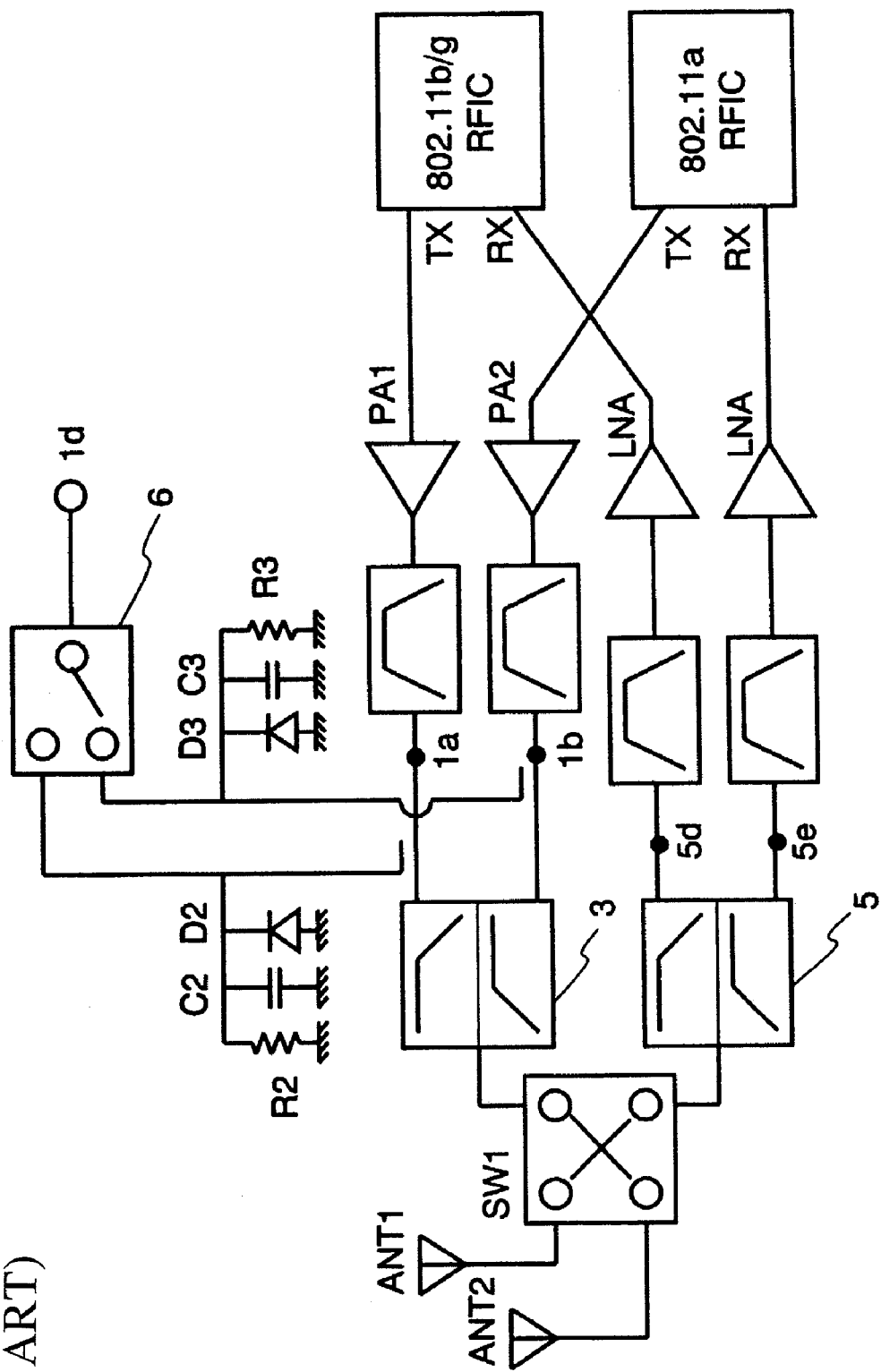
FIG. 15 is a block diagram showing one example of high-frequency circuits having conventional detection functions.
Figure 16:
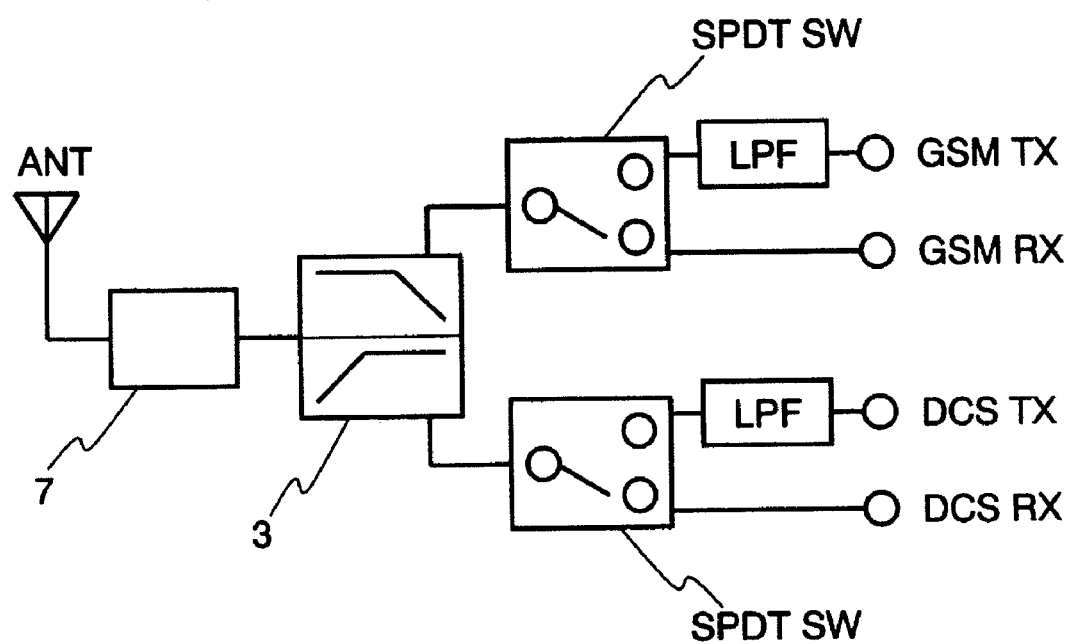
FIG. 16 is a block diagram showing another example of high-frequency circuits having conventional detection functions.

FIG. 5 shows a high-frequency circuit according to a further embodiment of the present invention. This high-frequency circuit comprises a dual-pole, dual-throw (DPDT) switch circuit 8 for switching a transmission signal and a receiving signal, which has at least two multi-band antenna ends 5a, 5b capable of transmitting and receiving signals in a 2.4-GHz band and a 5-GHz band, a transmission end 1c for inputting transmission signals in a 2.4-GHz band and a 5-GHz band, and a receiving end 5c for outputting receiving signals in a 2.4-GHz band and a 5-GHz band. The receiving end 5c of the switch circuit 8 is connected to a receiving diplexer 5 for dividing the receiving signals in a 2.4-GHz band and a 5-GHz band, and the transmission end 1c of the switch circuit 8 is connected to an output end of a coupler 2 in the same high-frequency circuit as shown in FIG. 4. The circuit structure downstream of the input ends 1a, 1b of the transmitting diplexer 3, and the circuit structure downstream of the output ends 5d, 5e of the receiving diplexer 5 are the same as shown in FIG. 15.

This circuit structure provides an RF front-end circuit applicable to multi-band communications systems of IEEE802.11a, IEEE802.11b and IEEE802.11g. This high-frequency circuit provides small detection voltage variations depending on frequency, and achieves miniaturization due to a small number of parts. Thus, it is optimum for a multi-band communications apparatus of IEEE802.11h having a TPC function. Although FIG. 5 shows the transmission end 1c connected to the high-frequency circuit shown in FIG. 4, the same effects can be obtained by connecting the transmission end 1c to any one of the high-frequency circuits shown in FIGS. 1-3.

Figure 6:
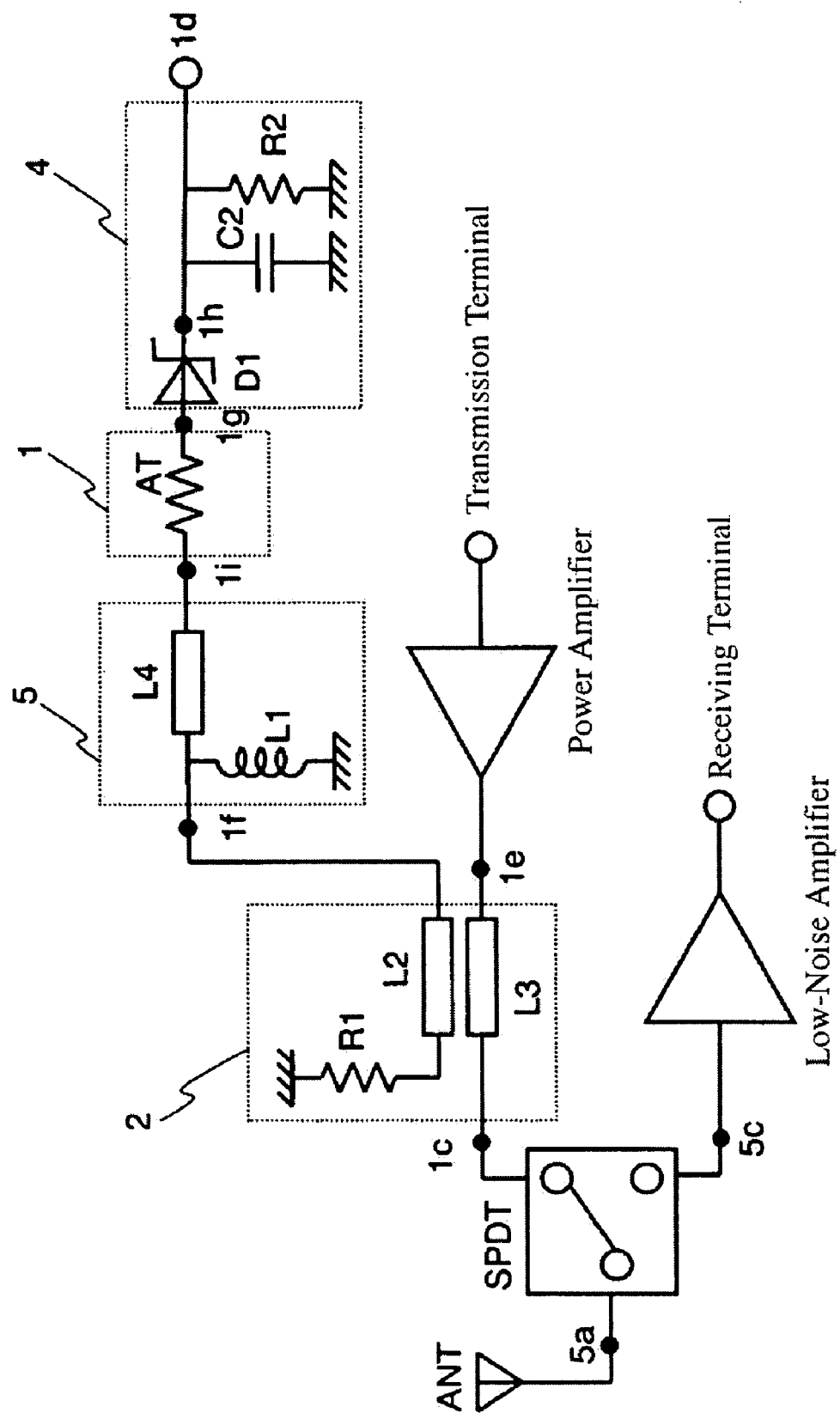
FIG. 6 is a block diagram showing a high-frequency circuit comprising a harmonics-suppressing circuit according to a still further embodiment of the present invention.

Although the high-frequency circuits capable of handling two bands at 2.4 and 5 GHz have been explained above, the present invention is not restricted thereto. For instance, as shown in FIG. 6, it is applicable to a communications system comprising a single-pole, dual-throw (SPDT) switch circuit 9 for switching an antenna end 5a, a transmission end 1c for inputting a transmission signal from a power amplifier, and a receiving end 5c for outputting a receiving signal to a low-noise amplifier may be disposed, such that a transmission signal and a receiving signal in one band can be switched. This communications system can also provide the effects of the present invention, because the transmission end 1c is connected to the output end of the coupler 2 in the high-frequency circuit shown in FIG. 4.

EFFECT OF THE INVENTION

Because the harmonics-suppressing circuit is connected to the secondary line of the coupler, the high-frequency circuit of the present invention has a detection function for two transmission lines, thereby reducing harmonics reflected from the detection diode. Also, a matching circuit provides the high-frequency circuit with small detection voltage difference in two frequencies, and miniaturization due to a small number of parts. The use of such high-frequency circuit provides a communications apparatus for wireless LAN, etc., which is optimum for communications systems of IEEE802.11h having a TPC function.

What is claimed is:

1. A high-frequency circuit for use in a dual-band wireless communications apparatus selectively using first and second frequency bands, comprising
   a diplexer for sending either one of transmission signals in said first and second frequency bands to an antenna,
   a coupler having a primary line connected to a common end of said diplexer and a secondary line,
   a detector comprising a detection diode for detecting a transmission power of a high-frequency signal sent from the secondary line of said coupler, and
   a harmonics-suppressing circuit disposed in series between the secondary line of said coupler and said detection diode,
   wherein said harmonics-suppressing circuit is an attenuator circuit constituted by only one or more resistors,
   wherein said first frequency band is lower than said second frequency band,
   wherein a matching circuit constituted by a shunt inductor and a phase circuit is disposed between the secondary line of said coupler and said harmonics-suppressing circuit for impedance matching between the coupling end of said secondary line and the detection diode in said first frequency band, and
   wherein a difference between a detection voltage in said first frequency band and a detection voltage in said second frequency band is reduced by said matching circuit.

2. A high-frequency circuit for use in a dual-band wireless communications apparatus selectively using first and second frequency bands, comprising
   a diplexer for sending either one of transmission signals in said first and second frequency bands to an antenna,
   a coupler having a primary line connected to a common end of said diplexer and a secondary line,
   a detector comprising a detection diode for detecting a transmission power of a high-frequency signal sent from the secondary line of said coupler, and
   a harmonics-suppressing circuit disposed in series between the secondary line of said coupler and said detection diode,
   wherein said harmonics-suppressing circuit is an attenuator circuit constituted by only one or more resistors,
   wherein said first frequency band is lower than said second frequency band, wherein a matching circuit constituted by a phase circuit is disposed between the secondary line of said coupler and said harmonics-suppressing circuit for impedance matching between the coupling end of said secondary line and the detection diode in said first frequency band, and wherein a difference between a detection voltage in said first frequency band and a detection voltage in said second frequency band is reduced by said matching circuit.

3. A high-frequency circuit for use in a dual-band wireless communications apparatus selectively using first and second frequency bands, comprising a diplexer for sending either one of transmission signals in said first and second frequency bands to an antenna comprising one or more antenna ends, a coupler having a primary line connected to a common end of said diplexer and a secondary line, a detector comprising a detection diode for detecting a transmission power of a high-frequency signal sent from the secondary line of said coupler, and a harmonics-suppressing circuit disposed in series between the secondary line of said coupler and said detection diode, wherein said harmonics-suppressing circuit is an attenuator circuit constituted by only one or more resistors wherein said first frequency band is lower than said second frequency band, and wherein a matching circuit is disposed between the secondary line of said coupler and said harmonics-suppressing circuit for impedance matching between the coupling end of said secondary line and the detection diode in said first frequency band, and wherein a difference between a detection voltage in said first frequency band and a detection voltage in said second frequency band is reduced by said matching circuit.

4. The high-frequency circuit according to claim 3, wherein said attenuator circuit is constituted by only one resistor.

5. The high-frequency circuit according to claim 3, comprising a switch circuit for switching the transmission signals of said first and second frequency bands and a receiving signal, which comprises the one or more antenna ends for inputting and outputting the transmission signals of said first and second frequency bands and the receiving signal, one or more transmission ends for inputting the transmission signals of said first and second frequency bands, and one or more receiving ends for outputting the receiving signal, said transmission end of said switch circuit being connected to the primary line of said coupler.

6. A communications apparatus comprising the high-frequency circuit recited in claim 3.

* * * * *